US012341537B2

United States Patent
Li et al.

(10) Patent No.: US 12,341,537 B2
(45) Date of Patent: *Jun. 24, 2025

(54) PARTITIONAL DATA COMPRESSION

(71) Applicant: International Business Machines Corporation, Armonk, NY (US)

(72) Inventors: Shuo Li, Beijing (CN); Xiaobo Wang, Beijing (CN); Leilei Li, San Jose, CA (US); Sheng Yan Sun, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 124 days.

This patent is subject to a terminal disclaimer.

(21) Appl. No.: 18/359,032

(22) Filed: Jul. 26, 2023

(65) Prior Publication Data

US 2023/0370086 A1    Nov. 16, 2023

Related U.S. Application Data

(63) Continuation of application No. 17/668,561, filed on Feb. 10, 2022, now Pat. No. 11,777,519.

(51) Int. Cl.
*H03M 7/40*    (2006.01)
(52) U.S. Cl.
CPC ....... *H03M 7/4093* (2013.01); *H03M 7/4062* (2013.01)
(58) Field of Classification Search
CPC ............. H03M 7/4093; H03M 7/4062; H03M 7/4037; H03M 7/6088; H03M 7/3079
See application file for complete search history.

(56) References Cited

U.S. PATENT DOCUMENTS

| 8,427,346 | B2 | 4/2013 | Potkonjak | |
|---|---|---|---|---|
| 9,672,235 | B2 | 6/2017 | Schreter | |
| 9,792,227 | B2 | 10/2017 | Ki et al. | |
| 9,910,855 | B2 | 3/2018 | Dickie | |
| 11,777,519 | B2 * | 10/2023 | Li | H03M 7/4093 341/67 |
| 2008/0077570 | A1 * | 3/2008 | Tang | G06F 16/3346 707/999.005 |

(Continued)

FOREIGN PATENT DOCUMENTS

| CN | 104932956 A | 9/2015 |
|---|---|---|
| CN | 105373342 A | 3/2016 |

(Continued)

OTHER PUBLICATIONS

International Searching Authority, "Notification of Transmittal of the International Search Report and the Written Opinion of the International Searching Authority, or Declaration," Patent Cooperation Treaty, Mar. 22, 2023, 9 pages, International Application No. PCT/CN2023/070714.

(Continued)

*Primary Examiner* — Lam T Mai
(74) *Attorney, Agent, or Firm* — Jared C. Chaney

(57) ABSTRACT

A system collects statistical data for a data page, divides the data page into parts, analyzes the data page and the statistical data, based on compression efficiency of one or more compression methods for each part of each page, to determine a compression method for each part of page, and compresses, based on the analyzing, the parts of the data page.

20 Claims, 9 Drawing Sheets

(56) References Cited

U.S. PATENT DOCUMENTS

| | | | |
|---|---|---|---|
| 2016/0092453 A1 | 3/2016 | Oberhofer et al. | |
| 2018/0246934 A1* | 8/2018 | Arye | G06F 16/9538 |
| 2018/0246950 A1* | 8/2018 | Arye | G06F 16/2272 |
| 2019/0188204 A1* | 6/2019 | Arye | G06F 16/27 |
| 2020/0334232 A1* | 10/2020 | Arye | G06F 16/215 |
| 2020/0334254 A1* | 10/2020 | Arye | G06F 16/2393 |
| 2021/0034586 A1* | 2/2021 | Arye | G06F 16/24539 |
| 2021/0034587 A1* | 2/2021 | Arye | H03M 7/70 |
| 2021/0034598 A1* | 2/2021 | Arye | G06F 16/288 |
| 2021/0191915 A1* | 6/2021 | Arye | G06F 16/24532 |
| 2021/0216232 A1 | 7/2021 | Xie et al. | |

FOREIGN PATENT DOCUMENTS

| | | | |
|---|---|---|---|
| CN | 107465413 A | 12/2017 | |
| CN | 109582223 A | 4/2019 | |
| CN | 109814809 A | 5/2019 | |
| CN | 112684975 A | 4/2021 | |
| JP | 2021-052263 A | 4/2021 | |

OTHER PUBLICATIONS

Mell, et al., "The NIST Definition of Cloud Computing," Recommendations of the National Institute of Standards and Technology, U.S. Department of Commerce, Special Publication 800-145, Sep. 2011, 7 pgs.

List of IBM Patents or Patent Applications Treated as Related, Jul. 26, 2023, 2 pages.

* cited by examiner

PARTITIONAL DATA COMPRESSION

BACKGROUND

Aspects of the present disclosure relate to the transmission and storage of data, and more particular aspects relate to partitional data compression.

Information in computer science is encoded as strings of characters (e.g., 1s and 0s). Encoding, in computers, can be defined as the process of transmitting or storing sequence of characters efficiently. In some instances, efficiency may be measured as using fewest number of bits in such a way that every encoding is unambiguous. There are several schemes currently used to compress data.

BRIEF SUMMARY

The present disclosure provides a method, computer program product, and system of partitional data compression. In some embodiments, the method includes collecting statistical data for a data page, dividing the data page into parts, analyzing the data page and the statistical data, based on compression efficiency of one or more compression methods for each part of each page, to determine a compression method for each part of page, and compressing, based on the analyzing, the parts of the data page.

Some embodiments of the present disclosure can also be illustrated by a computer program product comprising a computer readable storage medium having program instructions embodied therewith, the program instructions executable by a processor to cause the processors to perform a method, the method comprising collecting statistical data for a data page, dividing the data page into parts, analyzing the data page and the statistical data, based on compression efficiency of one or more compression methods for each part of each page, to determine a compression method for each part of page, and compressing, based on the analyzing, the parts of the data page.

Some embodiments of the present disclosure can also be illustrated by a system comprising a processor and a memory in communication with the processor, the memory containing program instructions that, when executed by the processor, are configured to cause the processor to perform a method, the method comprising collecting statistical data for a data page, dividing the data page into parts, analyzing the data page and the statistical data, based on compression efficiency of one or more compression methods for each part of each page, to determine a compression method for each part of page, and compressing, based on the analyzing, the parts of the data page.

DETAILED DESCRIPTION

Figure 1:
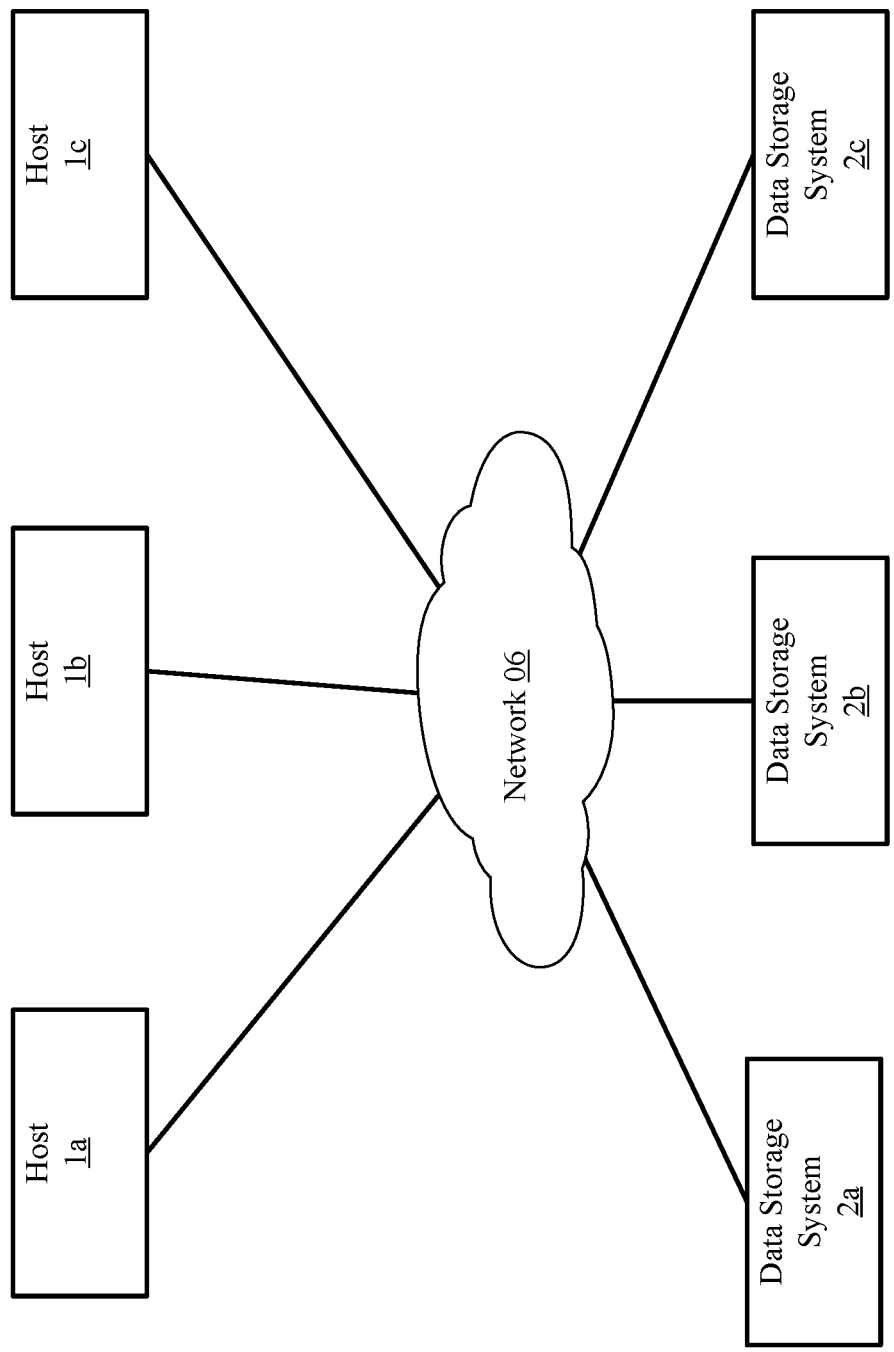
FIG. 1 illustrates an embodiment of a computing environment employing partitional data compression for a data storage system according to various embodiments of the present description.

Aspects of the present disclosure relate to partitional data compression. While the present disclosure is not necessarily limited to such applications, various aspects of the disclosure may be appreciated through a discussion of various examples using this context.

Data pages and index pages are very important for database systems. The users can reduce the amount of space that a data page and/or index occupies by compressing the index. A full-page compression is a high-cost operation. In some instances, a page is a unit of storage with a size that is configurable on a system-wide, database-wide, or conglomerate-specific basis.

Comparison between different compression methods has shown that there may not be a significant difference, in terms of the compression time (total time or CPU {Central Processing Unit} time) and compression size of the entire workload, between commonly used data compression schemes. For example, comparison between Huffman vs. fixed encoding length, for overall workload level in Daily Performance Regression Buckets (DPRB), has shown that there is no significant difference between the two in terms of the total elapsed time and total CPU time of the entire workload (e.g., an entire data page, or a group of data pages). In an example, a Huffman compression for a particular set of data pages saved=59% over the uncompressed data, and a Fixed Length compression data pages saved=54% over the uncompressed data. Query commands (e.g., Structured Query Language commands) are the instructions used to communicate with a database to perform tasks, functions, and queries with data.

However, individual packages and jobs show significant difference. For example, for factors such as other read I/O, database synchronization I/O, and power quality synchronization, the elapsed time varied in range of −73% to +380%. Likewise, for factors such as cost of hardware compression vs software partial decompression, data buffer pool getpages reduction, the CPU time varied in range of −15% to +101%. In some embodiments, a partitional compression may be used to improve the performance and/or efficiency of compression, by choosing a compression method that is most efficient for each data part. In some instances, efficiency refers to a size of the compressed part and hardware performance for the compression/decompression. In experimental test, the partial decompression method (referred to as partial decompression method herein) disclosed below has seen up to a 271% CPU improvement. See FIG. 6 below for test results.

A system of one or more computers may be configured for partitional data compression in accordance with the present description, by virtue of having software, firmware, hardware, or a combination of them installed on the system that in operation causes or cause the system to perform write transfer resource management in accordance with the present description. For example, one or more computer programs may be configured to perform partitional data compression for a data storage system by virtue of including instructions that, when executed by data processing apparatus such as for example a storage controller processor, cause the apparatus to perform the actions. As used herein, the term "compression" refers to any suitable algorithmic compression process which manipulates data by re-encoding a string of data so that the size of the resultant string of data is reduced in size compared to the original string of data prior to the algorithmic manipulation.

The operations described herein are performed by logic which is configured to perform the operations either automatically or substantially automatically with little or no system operator intervention, except where indicated as being performed manually. Thus, as used herein, the term "automatic" includes both fully automatic, that is operations performed by one or more hardware or software controlled machines with no human intervention such as user inputs to a graphical user selection interface. As used herein, the term "automatic" further includes predominantly automatic, that is, most of the operations (such as greater than 50%, for example) are performed by one or more hardware or software controlled machines with no human intervention such as user inputs to a graphical user selection interface, and the remainder of the operations (less than 50%, for example) are performed manually, that is, the manual operations are performed by one or more hardware or software controlled machines with human intervention such as user inputs to a graphical user selection interface to direct the performance of the operations.

Many of the functional elements described in this specification have been labeled as "logic," in order to more particularly emphasize their implementation independence. For example, a logic element may be implemented as a hardware circuit comprising custom VLSI circuits or gate arrays, off-the-shelf semiconductors such as logic chips, transistors, or other discrete components. A logic element may also be implemented in programmable hardware devices such as field programmable gate arrays, programmable array logic, programmable logic devices or the like.

A logic element may also be implemented in software for execution by various types of processors. A logic element which includes executable code may, for instance, comprise one or more physical or logical blocks of computer instructions which may, for instance, be organized as an object, procedure, or function. Nevertheless, the executables of an identified logic element need not be physically located together, but may comprise disparate instructions stored in different locations which, when joined logically together, comprise the logic element and achieve the stated purpose for the logic element.

Indeed, executable code for a logic element may be a single instruction, or many instructions, and may even be distributed over several different code segments, among different programs, among different processors, and across several memory devices. Similarly, operational data may be identified and illustrated herein within logic elements, and may be embodied in any suitable form and organized within any suitable type of data structure. The operational data may be collected as a single data set, or may be distributed over different locations including over different storage devices.

FIGS. 1-4 illustrate an embodiment of a partitional data compression for a data storage system in accordance with the present description. In this example, a plurality of hosts 1a, 1b . . . 1n may submit Input/Output (I/O) requests to one or more data storage devices or systems 2a, 2b, . . . 2n over a network 6 to access data stored by the data storage systems. The hosts 1a, 1b . . . 1n may be separate physical devices or may be virtual devices implemented using assigned resources of partitions of a server, for example. In a similar manner, the data storage systems 2a, 2b . . . 2n may be separate physical devices or may be virtual devices implemented using assigned resources of partitions one or more servers, for example.

Figure 2:
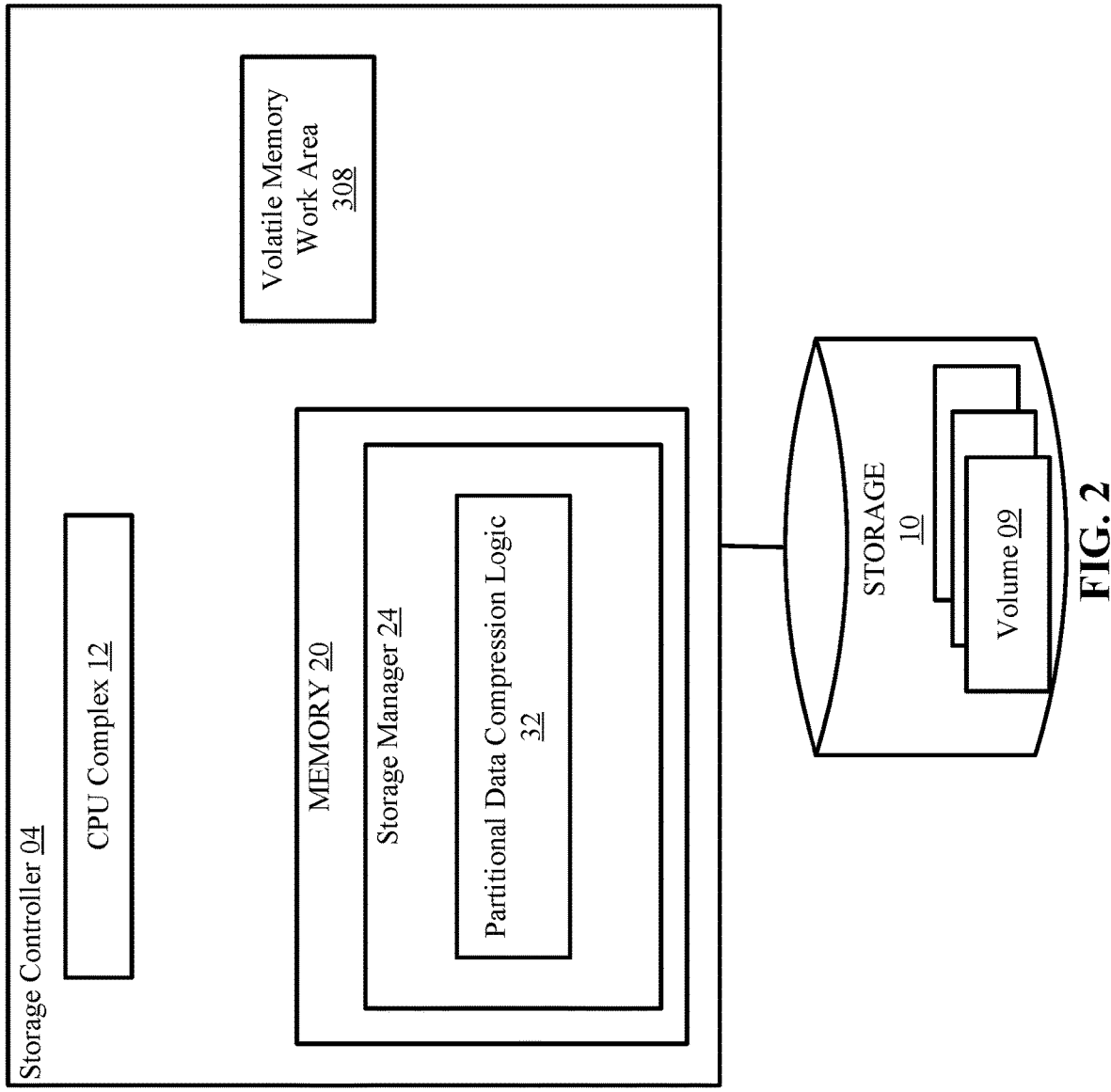
FIG. 2 illustrates an example of a data storage system including a storage controller of the computing environment of FIG. 1, employing partitional data compression for a data storage system according to various embodiments of the present description.
Figure 3:
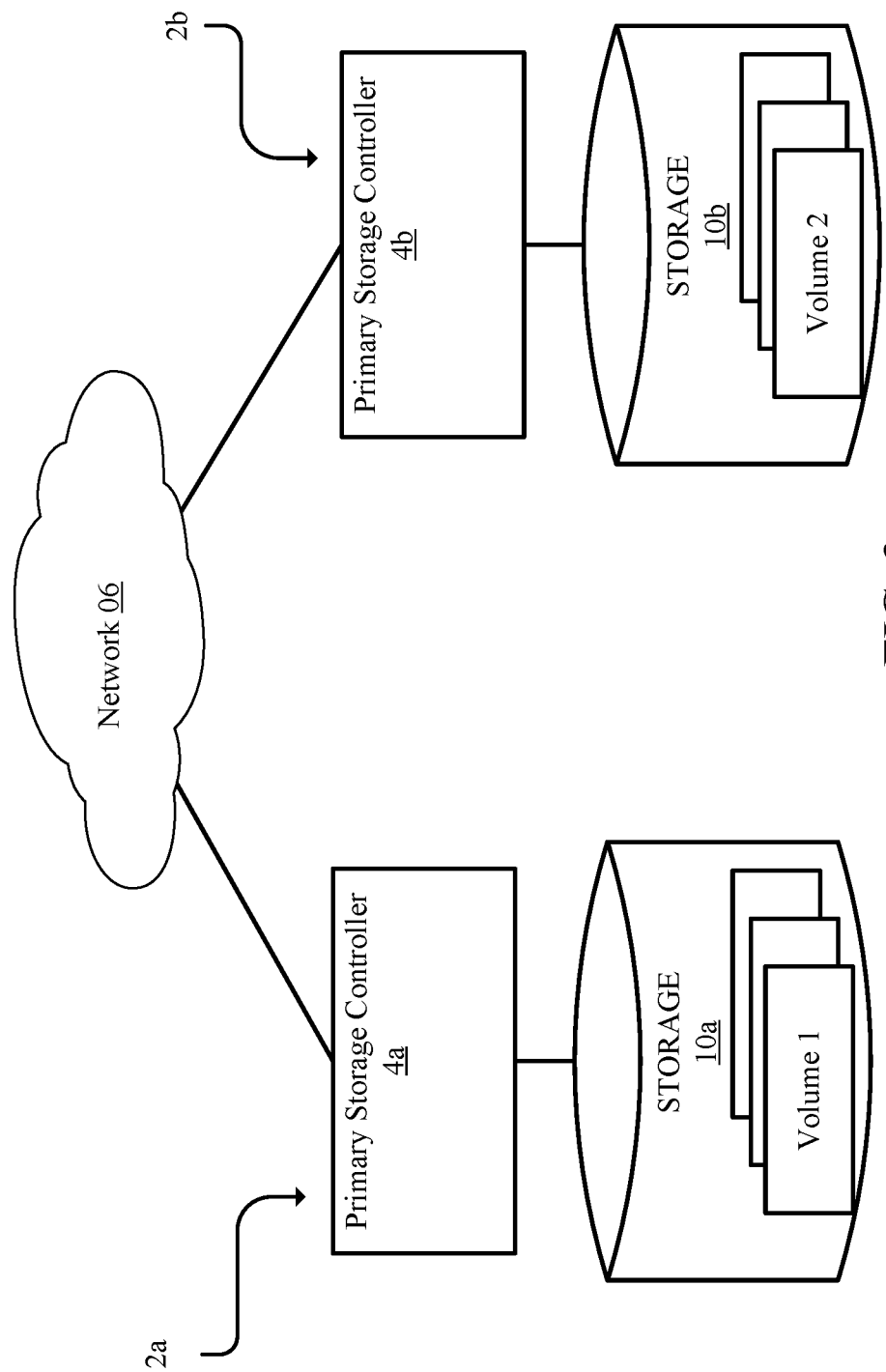
FIG. 3 illustrates an example of a primary and secondary data storage system including storage controllers of the computing environment of FIG. 1, employing partitional data compression for a data storage system according to various embodiments of the present description.

FIG. 2 shows in greater detail an example of a data storage system 2 employing partitional data compression in accordance with the present description. The data storage system 2 is similar to and representative of the data storage systems 2a, 2b . . . 2n (FIG. 1). FIG. 3 illustrates an example of a storage system having a primary data storage system 2a and a secondary data storage system 2b, in which one or both of the primary or secondary storage systems employ partitional data compression according to various embodiments of the present description.

Each data storage system 2 (FIG. 2), 2a, 2b . . . 2n (FIG. 1) includes a storage controller or control unit 4 (FIG. 2), 4a (FIG. 3), 4b which accesses data at volumes 9 (FIG. 2), volume1, volume2 (FIG. 3) (e.g., LUNs (Logical Units), Logical Devices, Logical Subsystems, etc.) in storage represented by one or more storage drives 10 (FIG. 2), 10a, (FIG. 3), 10b (FIG. 3). Each storage controller 4, 4a, 4b includes a CPU complex 12 (FIG. 2), including processor resources provided by one or more processors or central processing units, each having a single or multiple processor cores. In this embodiment, a processor core contains the components of a CPU involved in executing instructions, such as an arithmetic logic unit (ALU), floating point unit (FPU), and/or various levels of cache (such as L1 and L2 cache), for example. It is appreciated that a processor core may have other logic elements in addition to or instead of those mentioned herein.

Each storage controller 4 (FIG. 2), 4a (FIG. 3), 4b further has a memory 20 (FIG. 2) that includes a storage manager 24 for managing storage operations including writing data to or reading data from an associated storage 10, 10a (FIG. 3), 10b, respectively, in response to an I/O data request from a host. The storage operations managed by the storage manager 24 further include data replication operations from a primary volume1 (FIG. 3) of a primary data storage system such as the data storage system 2a, for example, to a secondary volume2 at a secondary data storage system such as the data storage system 2b, for example. The storage manager 24 is configured to generate copies of the primary volume1 (FIG. 3) of the primary data storage system 2a as a secondary volume2 (FIG. 3) of the secondary data storage system 2b. The pair of volumes, volume1, volume2 are in a copy relationship such that updates to the primary volume1 are replicated to the secondary volume2.

The CPU complex 12 of each storage controller may have multiple clusters of processors, each cluster having its own assigned memory 20, storage manager 24, cache, etc. The processing and memory resources assigned each cluster may be physical, virtual, shared, transferrable or dedicated, depending upon the particular application.

As described in greater detail below, partitional compression logic 32 of the storage manager 24 may collecting statistical data for a data page, the statistical data including the statistics may include, what data is hot data, what data is cold data, basic length for each record and groups in the record, database statistics, database activities, and related data distribution, decompressing the data page, dividing the data page into parts, analyzing the data page to determine the compression method for each part of page, and compressing, based on the analyzing, the parts of the data page. As a result, data may be compressed more efficiently.

In the illustrated embodiment, the storage manager 24 including the partitional data compression logic 32 of the storage manager 24, is depicted as software stored in the memory 20 and executed by the CPU complex 12. However, it is appreciated that the logic functions of the storage manager 24 may be implemented as hardware, software, firmware or any combination of one or more thereof, depending upon the particular application.

In one embodiment, the storage or storage drives 10, 10a, 10b may be comprised of one or more sequential access storage devices, such as hard disk drives and magnetic tape or may include non-sequential access storage devices such as solid state drives (SSD), for example. Each storage drive 10, 10a, 10b may comprise a single sequential or non-sequential access storage device or may comprise an array of storage devices, such as a Just a Bunch of Disks (JBOD), Direct Access Storage Device (DASD), Redundant Array of Independent Disks (RAID) array, virtualization device, tape storage, flash memory, etc.

The storage units of the storage drives 10, 10a, 10b may be configured to store data in subunits or domains of data storage such as volumes, tracks, extents, blocks, pages, segments, cylinders, etc. Although partitional data compression in accordance with the present description is described in connection with storage subunits such as volumes, it is appreciated that partitional data compression in accordance with the present description is applicable to other storage subunits such as tracks, extents, blocks, pages, segments, cylinders, etc.

The system components 1a, 1b . . . 1n, 4, 4a, 4b, 10, 10a, 10b are connected to the network 6 which enables communication among these components. Thus, the network 6 includes a fabric which may comprise a Storage Area Network (SAN), Local Area Network (LAN), Intranet, the Internet, Wide Area Network (WAN), peer-to-peer network, wireless network, arbitrated loop network, etc. Communication paths from the storage systems to the hosts 1a, 1b, . . . 1n may be based upon a particular host attachment protocol such as Fibre Connection (FICON), for example. Other communication paths of the fabric may comprise for example, a Fibre Channel arbitrated loop configuration, a serial loop architecture or a bus interface, such as a Peripheral Component Interconnect (PCI) interface such as a PCI-Express interface. The communication paths of the fabric may also be part of an Ethernet network, for example, such that each node has an individual network (internet protocol) address. Other types of communication paths may be utilized, such as a modem telephone path, wireless network, etc., depending upon the particular application.

Communication software associated with the communication paths includes instructions and other software controlling communication protocols and the operation of the communication hardware in accordance with the communication protocols, if any. It is appreciated that other communication path protocols may be utilized, depending upon the particular application.

Figure 4:
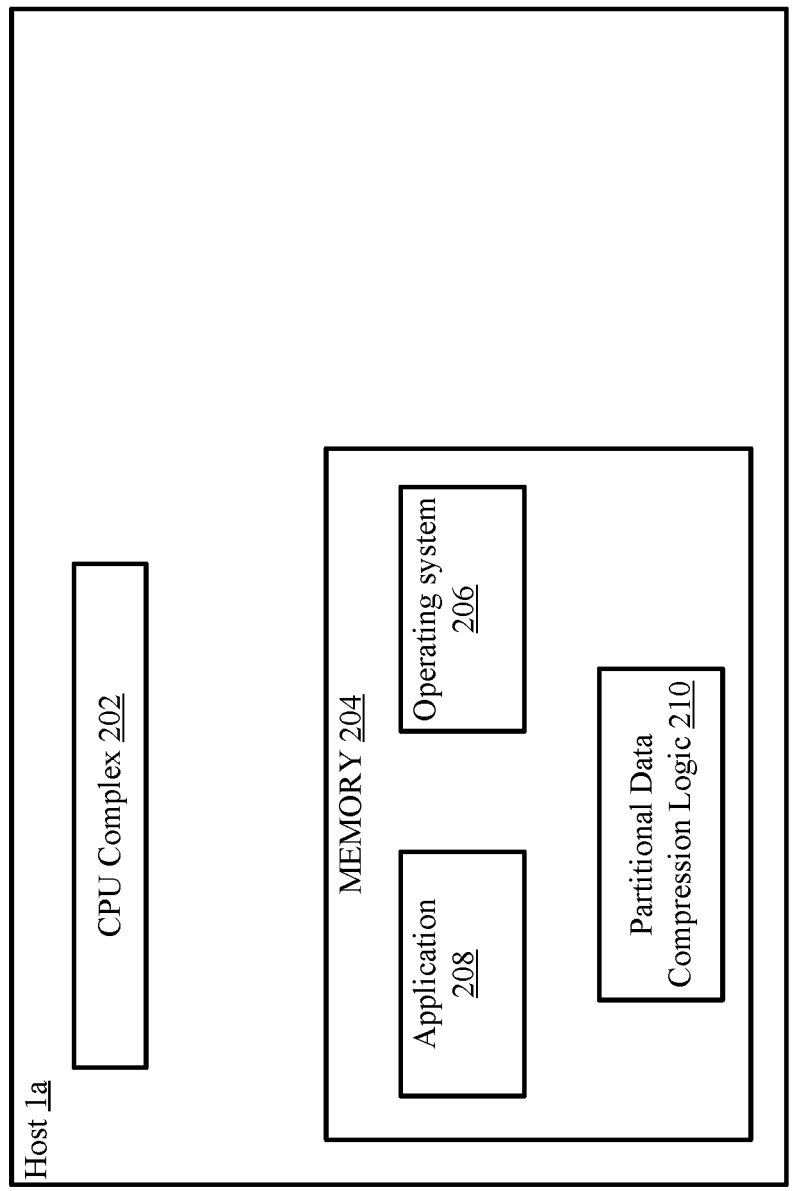
FIG. 4 illustrates an example of a host of the computing environment of FIG. 1, employing partitional data compression for a data storage system according to various embodiments of the present description.

A typical host as represented by the host 1a of FIG. 4 includes a CPU complex 202 and a memory 204 having an operating system 206 and an application 208 that cooperate to read data from and write data updates to the primary storage 10a (FIG. 3) or secondary storage 10b via a storage controller 4, 4a, 4b. An example of a suitable operating system is the z/OS operating system. It is appreciated that other types of operating systems may be employed, depending upon the particular application.

Partitional data compression in accordance with the present description, may be applied to any computer system providing data storage, as represented by the partitional data compression logic 32 (FIG. 2). Each host such as the host 1a, for example, may also employ partitional data compression logic 210 for partitional data compression data for storage.

In the illustrated embodiment, the partitional data compression logic 210 of the host 1a, is depicted as software stored in the memory 204 and executed by the CPU complex 202. However, it is appreciated that the logic functions of the partitional data compression logic 210 may be implemented as hardware, software, firmware or any combination of one or more thereof, depending upon the particular application.

The hosts 1a, 1b . . . 1n, the storage controllers 4, 4a, 4b controlling storage devices 10, 10a, 10b of the storage systems 2a, 2b . . . 2n, and the partitional data compression logic 32, 210 may each be implemented using any computational device which has been modified for partitional data compression in accordance with the present description. Computational devices suitable for modification as described herein include those presently known in the art, such as, a personal computer, a workstation, a server, a mainframe, a hand held computer, a palm top computer, a telephony device, a network appliance, a blade computer, a processing device, etc. The hosts 1a, 1b . . . 1n, the storage controllers 4, 4a, 4b controlling storage devices 10, 10a, 10b of the storage systems 2a, 2b . . . 2n, and the partitional data compression logic 32, 210, may be elements in any suitable network, such as, a storage area network, a wide area network, the Internet, an intranet, or elements in a cloud computing environment.

Figure 5:
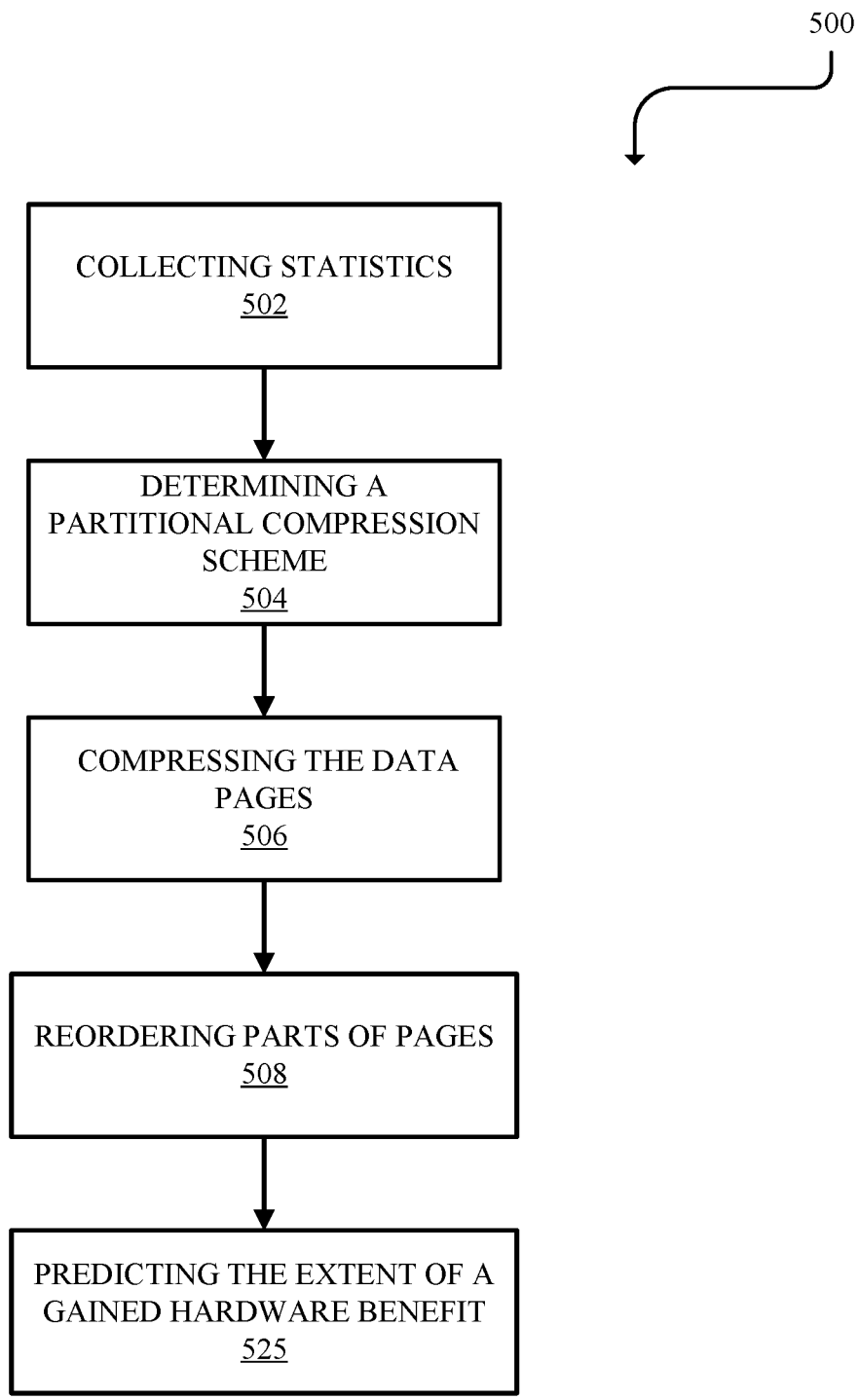
FIG. 5 illustrates an example of operations of a storage manager and the storage controller including the partitional data compression logic according to various embodiments of the present description.

FIG. 5 depicts an embodiment of operations 500 of the storage manager 24 (FIG. 2) and the storage controller 4 including the partitional data compression logic 32. In this example, logic elements of the storage manager 24 of the storage controller 4 are configured to perform a partitional compression method by employing data analytics to determine compression method and a reorganization scheme.

FIG. 5 begins with block 502 of collecting statistics for pages of data to record length calculations and update page header and real time statistics structure. The statistics (statistical data herein) may, for example, include, what data is hot data, what data is cold data, basic length for each record, and basic length for each part in the record, database statistics, database activities, and related data distribution. In some instances, data distribution is a function, list, table, and/or graph which details the possible values (or intervals) of the data. Data distribution may also identify how often values or strings occur. In some embodiments, data distribution may refer to how often a string of identical code is repeated on a given page. For example, in a compression scheme, it may be more beneficial (e.g., create a smaller compressed file) to use a small representative string (e.g., "1" instead of "010100011") a string of data that is repeated multiple times on a page. In some embodiments, data distribution may also refer to how hot and cold data parts are grouped in a page. In some embodiments, hot data is data that is overwritten more often. In some embodiments, cold data is data that is overwritten less often. As would be understood by one of ordinary skill in the art, the specific threshold of writes that would make data "hot" or "cold" may be highly dependent upon the system, such that what would be "hot" data in one system may be "cold" data in another system (or perhaps neither hot nor cold data, but somewhere in between). In some embodiments, how hot or cold data is may be relayed as a usage value with data over a first threshold being hot and data under a second threshold being cold. In some embodiments, hot data may indicate that smaller data blocks may be compressed, to make changes to one part of the data more efficient, and cold data may indicate that larger blocks should be compressed. In some instances, a data page retrieves data from a specified data source and caches that data as memory in set blocks. A data page is used for integration to the data source, separating processing details from integration details.

FIG. 5 continues with block 504 of determining a partitional compression scheme for the parts of the page of the data. In some embodiments, the database system checks the statistics in the page headers and real time statistics to decide the compression method for the pages. For example, when the data pages or the index pages are decompressed, the database system may check the statistics in the page headers and real time statistics to decide the compression method for the pages. In some embodiments, a page may be divided into multiple parts. For example, the parts may be divided based on rows or columns in each page.

In some embodiments, the optimizer (e.g., storage controller 4) divides and recalculates existing records based on the base length and the number of hot parts that have been collected. For example, the optimizer may divide a page into several parts (e.g., new data structures) or use previously generated parts of the page. In some embodiments, the division and recalculation may be performed to minimize resource usage (e.g., disk space or CPU time). For example, a page that is divided into two parts may take 20% more storage or CPU time when compressed verses dividing the same page into 20 parts.

In some embodiments, the system may designate a storage to cache the grouping result. In some embodiments, when the allocated storage is exhausted, optimizer may clear older grouping results.

In some embodiments, each part may have a different compression ratio (e.g., compressed size verses the uncompressed size) for each compression method. The system may reorder or redistribute data parts to group the non-frequently accessed parts (e.g., cold parts) together so they may efficiently be compressed with methods of high compression ratio to get higher performance. For example, if a particular part of the data is not accessed often, it may make sense to preserve data storage space by utilizing a method of compression that maximizes compression over a method that requires the least CPU time. Likewise, frequently accessed (e.g., hot parts) data may be compressed with a compression method that requires the least CPU time even if it creates a larger compressed result.

In some embodiments, after rearrangement of data parts, a header in the data parts may direct the system to parts in the original order. For example, optimizer may add more columns and rearrange those columns for compression performance, but the system may still need to be able to determine the original configuration of the data part. In some embodiments, the subdivided sections of the pages may be grouped by the compression scheme that provides the most efficient compression for the group of part without losing the original arrangement of data in the data page.

In some embodiments, partitional data compression logic 32 may generate a prediction model in preparation for compression or decompression as new data is gained. For example, the model may predict basic length, hit rate for pages, and hit rates for parts of pages. In some embodiments, the prediction model may be run iteratively to improve free space and compress/decompress performance by updating the compression methods and grouping of the parts. Thus the system may predict what compression scheme is most likely to be beneficial and even pre-decompress data (e.g., hot data) before it is needed (referred to as soft-decompress herein). In some instances, hit rate may be measured in several ways. In one example, it is the number of queries for a part of the data verses the number of queries for a larger data group (e.g., a data page). In another example, hit rate is the frequency in which a particular segment of data is changed.

In some embodiments, the statistics includes the number of characters for each part described as a weight herein. For example, the groups may range according to the weight from large (many characters) to small (a few characters).

In some embodiments, the determination may include generating a Huffman tree based on the weight of the groups. In some instances, a Huffman tree is built by:
1. Creating a leaf node for each unique character and build a min heap of all leaf nodes (min heap is used as a priority queue. The value of frequency field is used to compare two nodes in min heap. Initially, the least frequent character is at root).
2. Extracting two nodes with the minimum frequency from the min heap.
3. Creating a new internal node with a frequency equal to the sum of the two nodes frequencies. Make the first extracted node as its left child and the other extracted node as its right child. Add this node to the min heap.
4. Repeating steps #2 and #3 until the heap contains only one node. The remaining node is the root node and the tree is complete.

FIG. 5 continues with block 506 where the pages are compressed based on the scheme determined in block 504. In some embodiments, the compression methods, determined in block 504, used for each page are recorded in the logs for the page.

FIG. 5 continues with block 508 of re-ordering parts of pages based on historical compress/decompress activities. In some embodiments, the re-assigning includes moving data to different performance layers within the database based on the hit rate. For example, data that is accessed the most often may be put on the highest performance layer, and data that is not accessed as often may be put on a lower performance layer.

In some embodiments, the re-assigning includes grouping data that is to be compressed with the same method. For example, if two parts of a data page are to be compressed with the same method, they may be grouped (and therein compressed with the same method).

In some embodiments, data may be analyzed to build a time series model, based on related features, to predict related hot parts. For example, two groups of hot data with similar statistical factors may be related. Thus, by using historical data particular parts that are likely to become hot may be identified and a decompression scheme for the newly identified hot parts may be determined. In some embodiments, the system may predict, based on a compress/decompress activities in the statistical data, the hot parts and candidate compression techniques based on a time series model.

In some embodiments, based on the time series model, the database may perform a "soft" pre-decompress for data that is predicted to be needed in the near future. A "soft" pre-decompress decompresses data that is predicted to be needed, but has not actually been requested.

Likewise, based on the time series model, the system may communicate with hardware to promote or demote data parts to different tiers of storage according to the impact on the hardware system. In some embodiments, particular compression decompression methods may work more efficiently with different tiers of storage. Therefore, the system may determine that, based on the time series model, data pages or parts of data pages perform more efficiently in a particular tier of storage based on the compression method and hardware being used.

FIG. 5 continues with block 510 of predicting, with the generated time series model, the extent of a gained hardware benefit (e.g., CPU processing time) from the partitional compression, the extent of a gained hardware benefit (e.g., CPU processing time) from the re-ordering of the parts, and the extent of a gained hardware benefit (e.g., CPU processing time) from the promoting (e.g., moving them to a higher tier of storage) of the hot parts.

Figure 6:
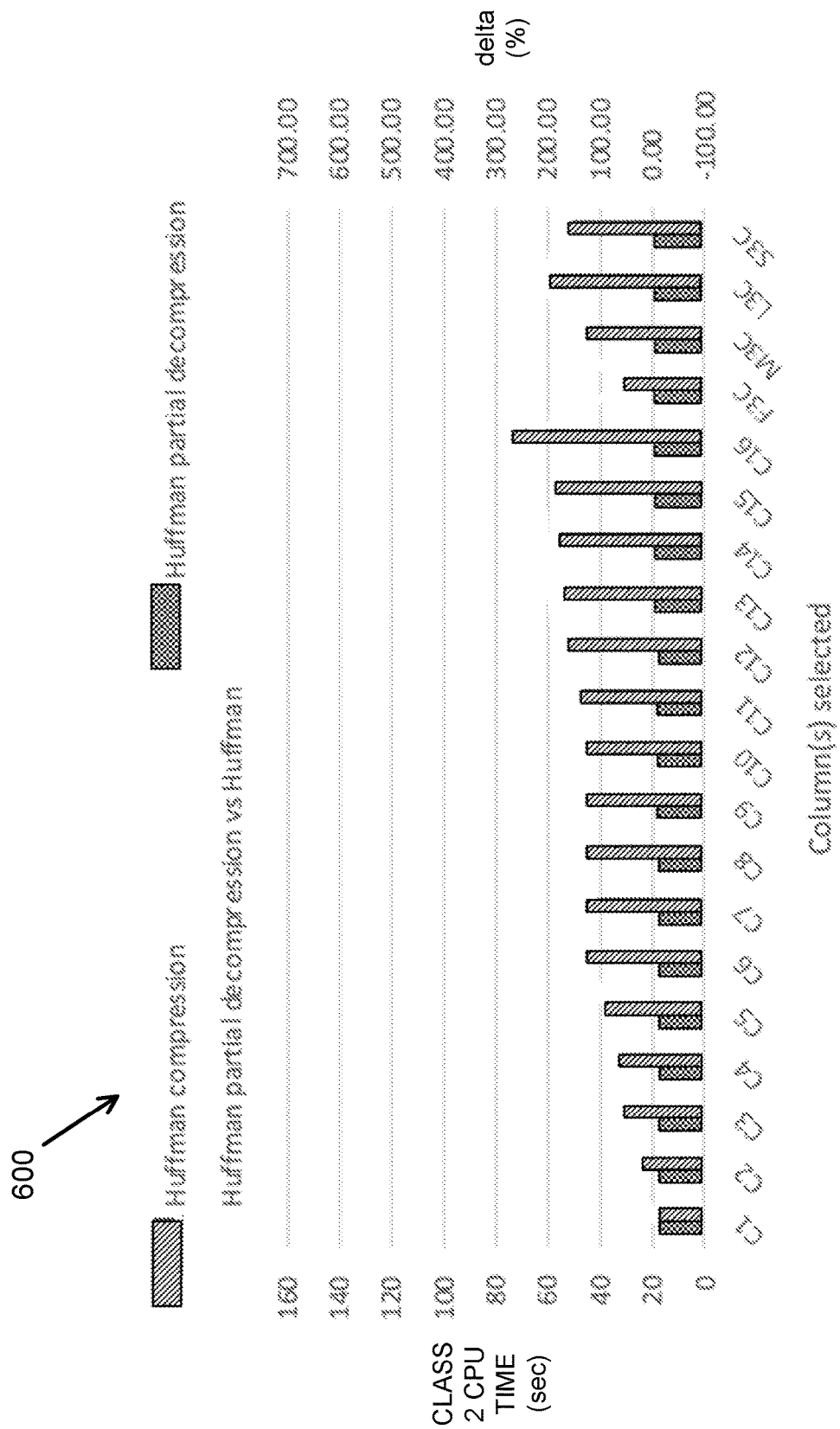
FIG. 6 illustrates a compression rate graph of experimental data from partitional compression of multiple data parts according to various embodiments of the present description.

FIG. 6 displays a compression rate graph 600 of experimental data from partitional compression of multiple data parts (here columns). As can be seen overall, using only a Huffman method to compress all the data parts requires more CPU time overall than using the described method above to selectively choose the compression method. For example, data part C1 has the same the same CPU time for both methods, because the Huffman compression would be used for both methods. However, data parts C2, C3, C4, C5, C6, C7, C8, C9, C10, C11, C12, C13, C14, C15, C16, F3C, M3C, L3C, and S3C have shown an increase in CPU time using the partial decompression technique described herein since those parts use a method that is more efficient for each part of the data, other than Huffman compression, to compress each part. This is true even though the Huffman method may be the most efficient compression method if all the data was compressed using a single compression method.

Figure 7:
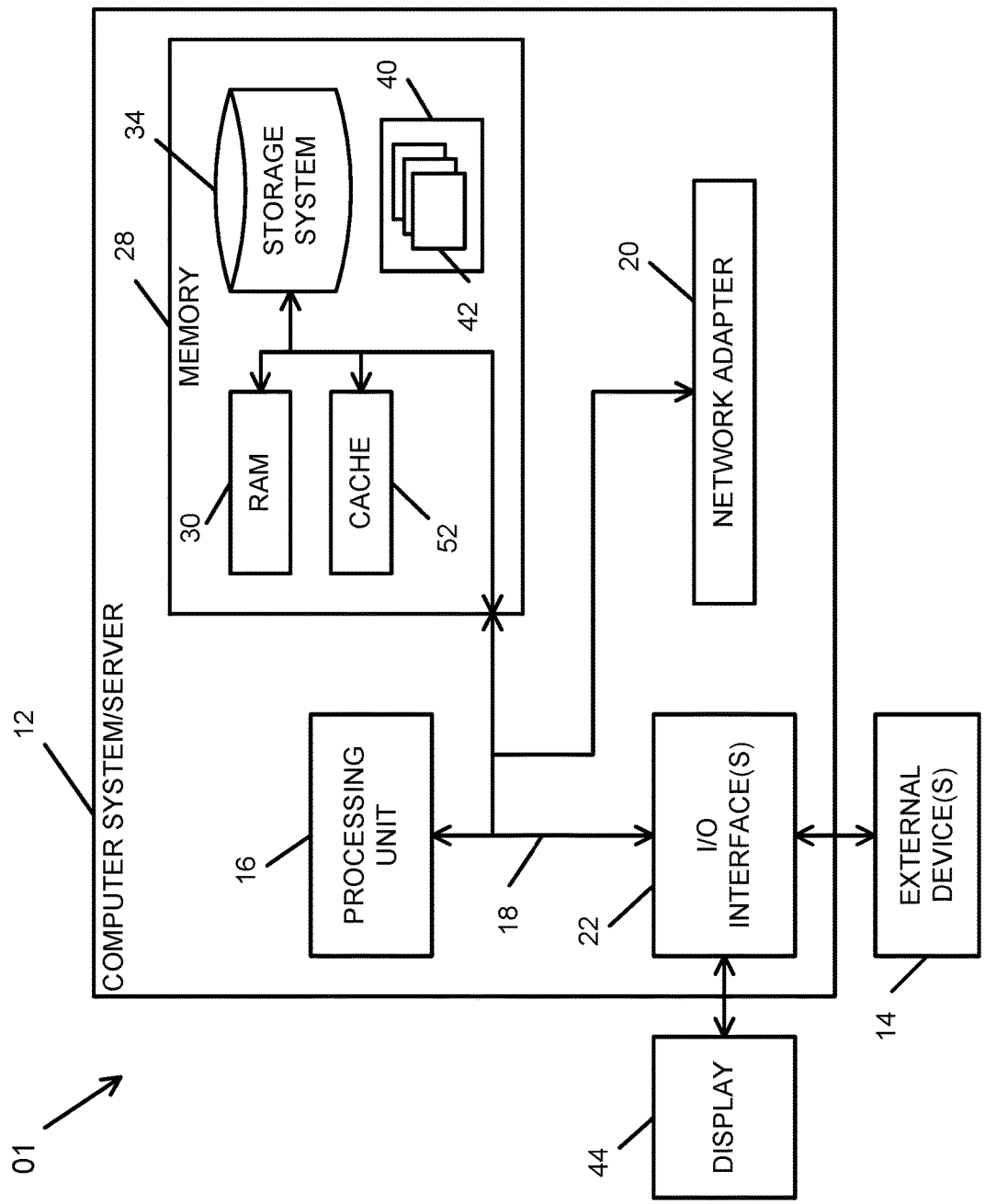
FIG. 7 illustrates a computer system according to various embodiments of the present invention.

In an exemplary embodiment, the system includes computer system 01 as shown in FIG. 7 and computer system 01 may perform one or more of the functions/processes described above. Computer system 01 is only one example of a computer system and is not intended to suggest any limitation as to the scope of use or functionality of embodiments of the present invention. Regardless, computer system 01 is capable of being implemented to perform and/or performing any of the functionality/operations of the present invention.

Computer system 01 includes a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices.

Computer system/server 12 may be described in the general context of computer system-executable instructions, such as program modules, being executed by a computer system. Generally, program modules may include routines, programs, objects, components, logic, and/or data structures that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 7, computer system/server 12 in computer system 01 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and includes both volatile and non-volatile media, removable and non-removable media.

System memory 28 can include computer system readable media in the form of volatile memory, such as random access memory (RAM) 30 and/or cache memory 52. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As is further depicted and described below, memory 28 may include at least one program product having a set (e.g., at least one) of program modules that are configured to carry out the functions/operations of embodiments of the invention.

Program/utility 40, having a set (at least one) of program modules 42, may be stored in memory 28 by way of example, and not limitation. Exemplary program modules 42 may include an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the present invention.

Computer system/server 12 may also communicate with one or more external devices 14 such as a keyboard, a pointing device, a display 44, one or more devices that enable a user to interact with computer system/server 12, and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Cloud Computing

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 8:
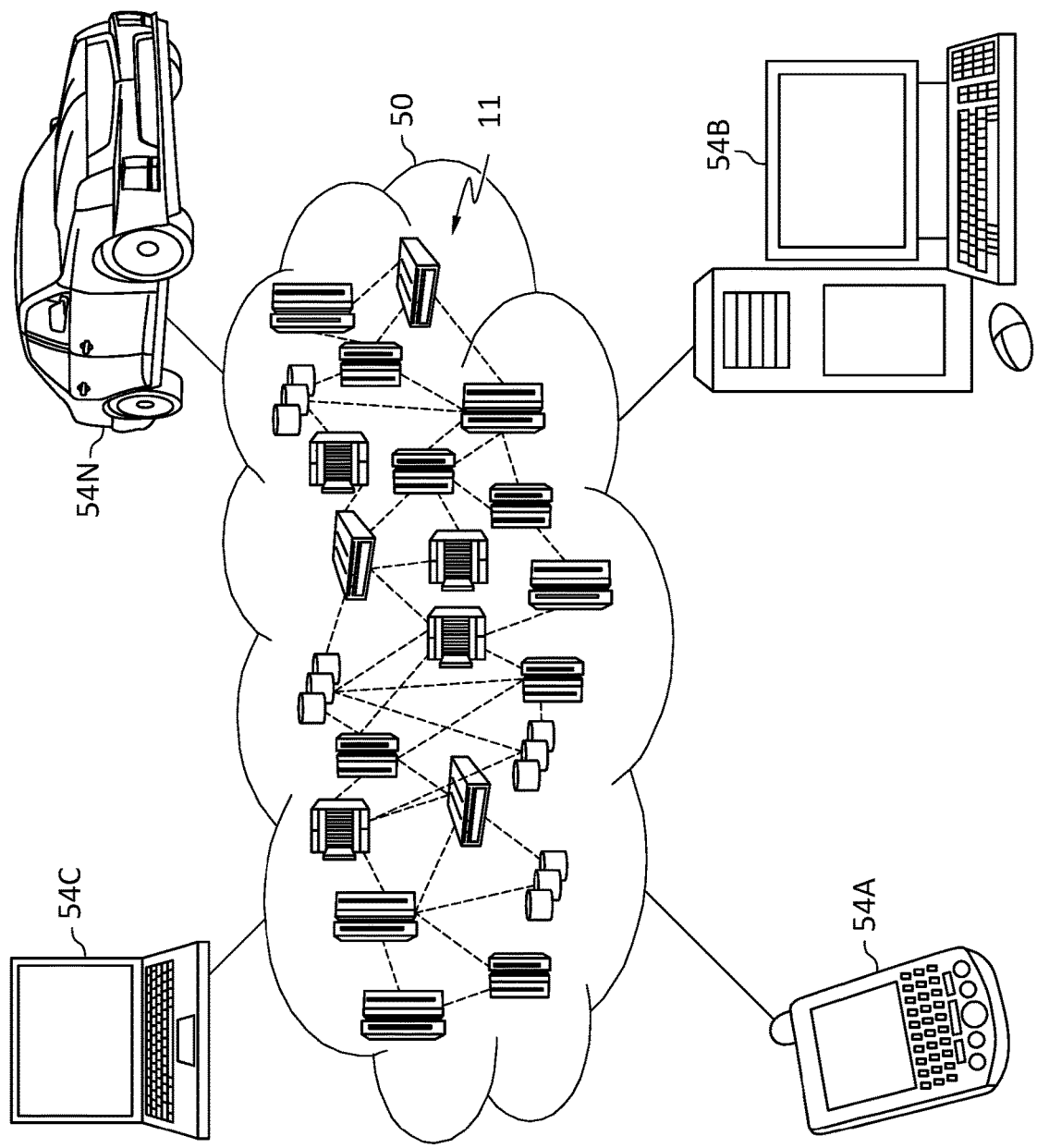
FIG. 8 illustrates a cloud computing environment according to various embodiments of the present invention.

Referring now to FIG. 8, illustrative cloud computing environment 50 is depicted. As shown, cloud computing environment 50 includes one or more cloud computing nodes 11 with which local computing devices used by cloud consumers, such as, for example, personal digital assistant (PDA) or cellular telephone 54A, desktop computer 54B, laptop computer 54C, and/or automobile computer system 54N may communicate. Nodes 11 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 8 are intended to be illustrative only and that computing nodes 11 and cloud computing environment 50 can communicate with any type of computerized device over any type of network and/or network addressable connection (e.g., using a web browser).

Figure 9:
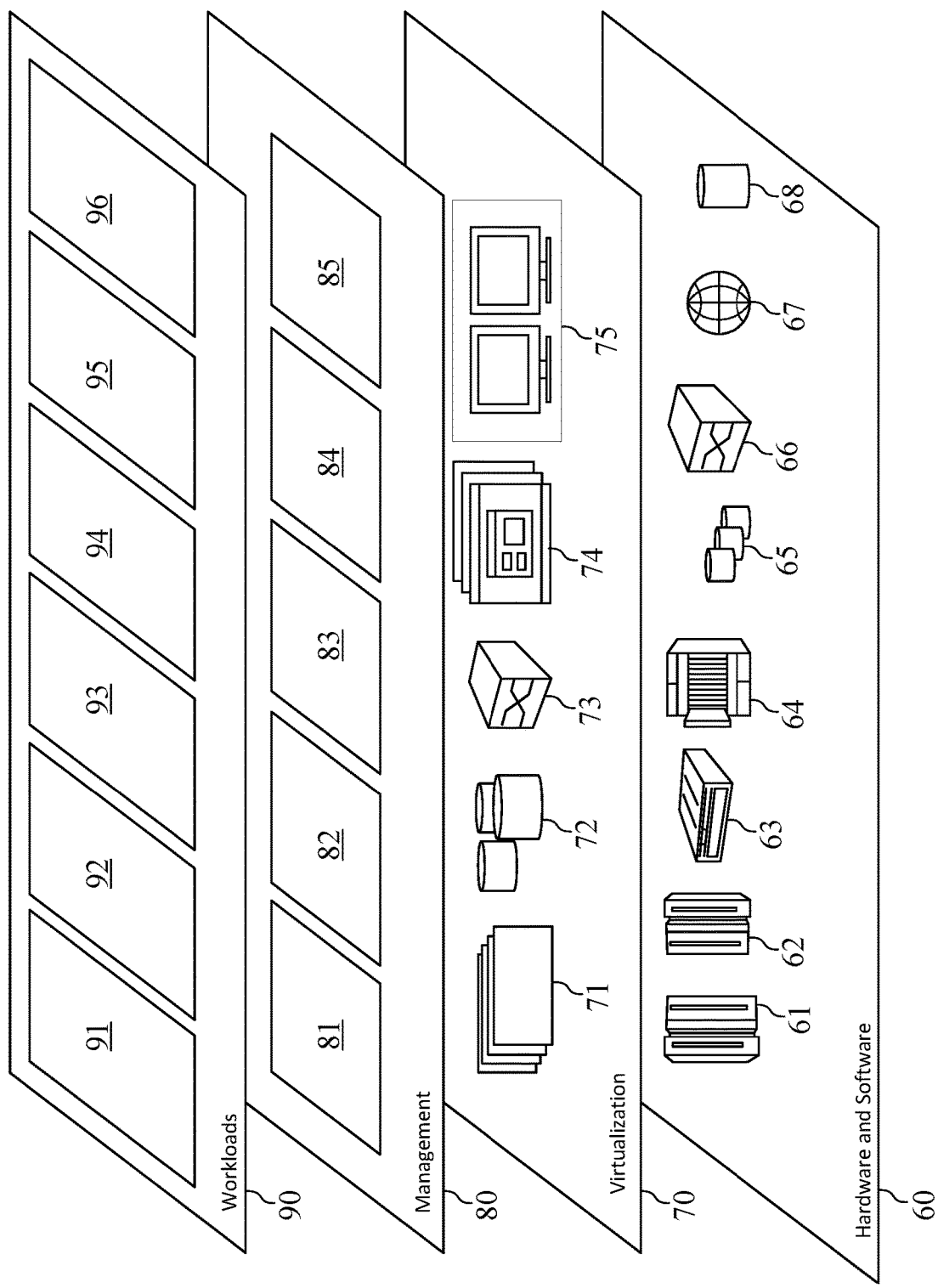
FIG. 9 illustrates abstraction model layers according to various embodiments of the present invention.

Referring now to FIG. 9, a set of functional abstraction layers provided by cloud computing environment 50 (FIG. 8) is shown. It should be understood in advance that the components, layers, and functions shown in FIG. 9 are intended to be illustrative only and embodiments of the invention are not limited thereto. As depicted, the following layers and corresponding functions are provided:

Hardware and software layer 90 includes hardware and software components. Examples of hardware components include: mainframes; RISC (Reduced Instruction Set Computer) architecture based servers; storage devices; networks and networking components. In some embodiments, software components include network application server software.

Virtualization layer 92 provides an abstraction layer from which the following examples of virtual entities may be provided: virtual servers; virtual storage; virtual networks, including virtual private networks; virtual applications and operating systems; and virtual clients.

In one example, management layer 94 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 96 provides examples of functionality for which the cloud computing environment may be utilized. Examples of workloads and functions which may be provided from this layer include: mapping and navigation; software development and lifecycle management; virtual classroom education delivery; data analytics processing; transaction processing; and mobile desktop.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A system comprising:
   a memory; and
   a processor in communication with the memory, the processor being configured to perform processes comprising:
   collecting statistical data for a data page;
   dividing the data page into parts;
   analyzing the data page and the statistical data, based on usage value for each part of each page, to determine a compression method for each part of page; and
   compressing, based on the analyzing, the parts of the data page.

2. The system of claim 1 wherein the statistical data includes data related to distribution of repeated strings on the data page.

3. The system of claim 1 further comprising:
   identifying, based on the statistical data, hot parts of the data page.

4. The system of claim 1 further comprising:
   redistributing the parts of the page by grouping hot parts and cold parts separately.

5. The system of claim 4 the redistributing further comprising:
   predicting, based on compress/decompress activities in the statistical data, the hot parts and candidate compression techniques based on a time series model.

6. The system of claim 1 further comprising:
   updating the compression method based on an update to the statistical data.

7. The system of claim 1, wherein the statistical data is selected from the group consisting of identified hot data, identified cold data, a basic length for each record and groups in each record, database statistics, database activities, related data distribution, and some combination therein.

8. A method comprising:
   collecting statistical data for a data page;
   dividing the data page into parts;
   analyzing the data page and the statistical data, based on usage value for each part of each page, to determine a compression method for each part of page; and
   compressing, based on the analyzing, the parts of the data page.

9. The method of claim 8 wherein the statistical data includes data related to distribution of repeated strings on the data page.

10. The method of claim 8 further comprising:
    identifying, based on the statistical data, hot parts of the data page.

11. The method of claim 8 further comprising:
    redistributing the parts of the page by grouping hot parts and cold parts separately.

12. The method of claim 11 the redistributing further comprising:
    predicting, based on compress/decompress activities in the statistical data, the hot parts and candidate compression techniques based on a time series model.

13. The method of claim 8 further comprising:
    updating the compression method based on an update to the statistical data.

14. The method of claim 8, wherein the statistical data is selected from the group consisting of identified hot data, identified cold data, a basic length for each record and groups in each record, database statistics, database activities, related data distribution, and some combination therein.

15. A computer program product comprising a non-transitory computer readable storage medium having program instructions embodied therewith, the program instructions executable by a processor to cause the processors to perform a method, the method comprising:
    collecting statistical data for a data page;
    dividing the data page into parts;
    analyzing the data page and the statistical data, based on usage value for each part of each page, to determine a compression method for each part of page; and
    compressing, based on the analyzing, the parts of the data page.

16. The computer program product of claim 15 wherein the statistical data includes data related to distribution of repeated strings on the data page.

17. The computer program product of claim 15 further comprising:
   identifying, based on the statistical data, hot parts of the data page.

18. The computer program product of claim 15 further comprising:
   redistributing the parts of the page by grouping hot parts and cold parts separately.

19. The computer program product of claim 18 the redistributing further comprising:
   predicting, based on compress/decompress activities in the statistical data, the hot parts and candidate compression techniques based on a time series model.

20. The computer program product of claim 15 further comprising:
   updating the compression method based on an update to the statistical data.

\* \* \* \* \*